United States Patent [19]

Hamilton et al.

[11] Patent Number: 5,688,350
[45] Date of Patent: Nov. 18, 1997

[54] METHOD OF LAMINATE MANUFACTURE

[75] Inventors: Sheila Hamilton, Greenock; Roy Cannon, Kilmacolm; Stewart Robertson, Kilmacolm; Jonathan Kennett, Howwood, all of United Kingdom

[73] Assignee: Teknek Electronics Limited, Renfrewshire, United Kingdom

[21] Appl. No.: 583,115

[22] PCT Filed: Jul. 13, 1994

[86] PCT No.: PCT/GB94/01519

§ 371 Date: May 1, 1996

§ 102(e) Date: May 1, 1996

[87] PCT Pub. No.: WO95/02509

PCT Pub. Date: Jan. 26, 1995

[30] Foreign Application Priority Data

Jul. 13, 1993 [GB] United Kingdom ............ 9314440

[51] Int. Cl.⁶ .................................................. B32B 31/00
[52] U.S. Cl. ................ 156/213; 156/281; 156/288; 156/312; 156/313; 156/323; 428/76
[58] Field of Search .......................... 156/312, 313, 156/288, 213, 281, 323; 428/76

[56] References Cited

U.S. PATENT DOCUMENTS 3,932,250  1/1976  Sato et al. ......................... 156/213

FOREIGN PATENT DOCUMENTS

| 214741 | 3/1987 | European Pat. Off. . |
| 262635 | 4/1988 | European Pat. Off. . |
| 464507 | 1/1992 | European Pat. Off. . |
| 85/01252 | 3/1985 | WIPO . |

OTHER PUBLICATIONS

Database WPI, Week 8921, Derwent Publications Ltd., London, GB; AN 89–153785 & JP,A,1 093 316 (Matsushita Elec Works) 12 Apr. 1989.

Patent Abstracts of Japan, vol. 15, No. 393 (M–1165) 4 Oct. 1991 & JP,A,03 161 198 (Matsushita Electric Works Ltd) 11 Jul. 1991.

Database WPI, Week 8820, Derwent Publications Ltd., London, GB; AN 88–136288 & JP,A,63 077 732 (Hitachi KK) 7 Apr. 1988.

*Primary Examiner*—John J. Gallagher
*Attorney, Agent, or Firm*—Ratner & Prestia

[57] ABSTRACT

A laminate such as a PCB material is formed by stacking resin impregnated prepreg sheets (10) between copper foils (12), applying heat and pressure around the periphery of the stack to form an edge-sealed unit, and subjecting a number of such units to a lay-up process in a separate clean area into which they are introduced via surface-cleaning means.

6 Claims, 2 Drawing Sheets

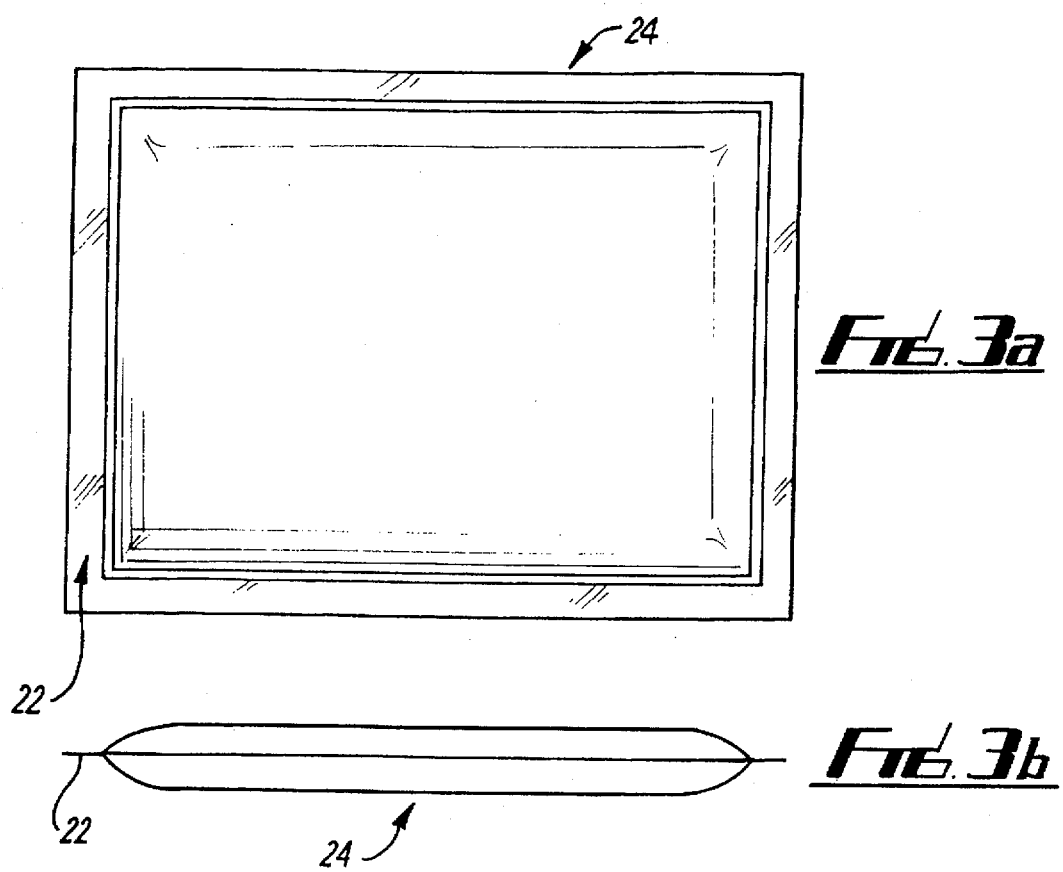
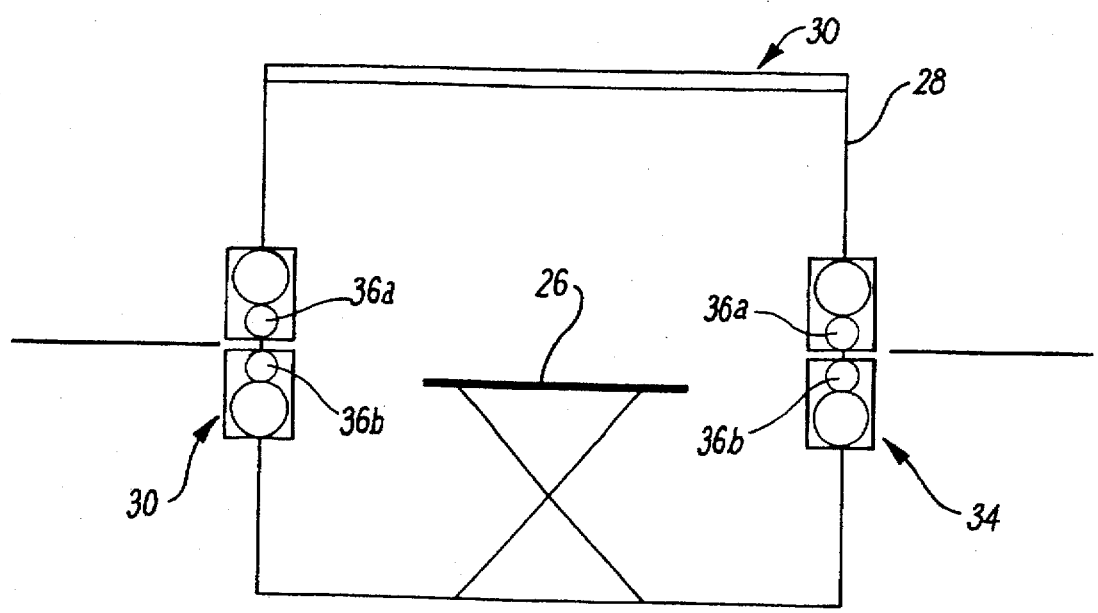

5,688,350

METHOD OF LAMINATE MANUFACTURE

This invention relates to laminates and printed circuit boards and more specifically to components employed in the manufacturing of such laminates.

BACKGROUND OF THE INVENTION

1) Field of the Invention

A printed circuit board laminate normally includes, as a component, several layers of a resin impregnated woven glass fiber cloth known as prepreg. On opposite sides of the prepreg are conductive copper foil sheets which are subsequently etched to produce the conductive tracks.

In the manufacturing process called lay-up, the requisite number of sheets of copper foil and prepreg are assembled onto a pressplate. A stack of such lay-ups is often built up. This stack is often called a book. The entire book is heated under pressure to bond the prepreg to the copper foil. After cooling, the sheets of laminate are separated and subjected to further processing.

2) Description of the Prior Art

FIG. 1 exemplifies the prior art lay-up process, in which prepreg sheets 1 and copper foils 2 are assembled between pressure plates 3.

One of the chief causes of contamination is the presence of resin dust and glass fibers from earlier processing of the prepreg. Because the prepreg is handled in the same area, particles of resin dust from the air land on the surface of the copper foil and press plates. Some particles remain even after wiping and during the pressing these particles melt and adhere to the surfaces.

This causes resin spots on the surface of the foil which prevent satisfactory etching of the copper. These spots can also cause pits and dents in the surface of the copper during the lamination process. If the press plates become contaminated with fused resin spots, they cause dents on the surface of the laminate each time they are used. The resin spots are very difficult to remove from the press plates except by severe abrasion which makes the press plates thinner and shortens their useful life.

One object of the present invention is to provide a method of lay-up which prevents any resin dust created in subsequent handling from being carried in the air onto the press plates. Another aspect is to allow the surfaces of the copper foil, especially thinner foils such as ½ oz foils, to be cleaned without wrinkling or damage prior to being assembled in the book.

SUMMARY OF THE INVENTION

The present invention provides a method of forming a metal-faced laminate, comprising forming a stack of plastics sheets between a pair of sheets of metal foil, applying heat and pressure to the edges of the stack to fuse the edges so as to form a sealed edge around the stack to form a sealed unit, cleaning the surfaces of the sheets of metal foil and subsequently heating the sealed unit while applying pressure to its major surfaces to fuse the stack into a laminate.

Preferably, the sealed edge is formed by applying sufficient heat in the area of the edge to melt the plastics material locally, and sufficient pressure to the area of the edge to press the metal foil sheets substantially together.

Preferably, the plastics sheets are resin impregnated woven glass fiber prepregs and the metal foil is of copper.

Preferably, the two heating and pressing steps are carried out in physically separated locations.

BRIEF DESCRIPTION OF THE DRAWINGS

An embodiment of the invention will now be described, by way of example, with reference to the accompanying drawings, in which:

FIGS. 3a and 3b are plan and side views, respectively, of the sealed unit formed by the apparatus of FIG. 2;

FIG. 4 is a schematic side view of a lay-up apparatus; and

DESCRIPTION OF PREFERRED EMBODIMENT

Figure 1:
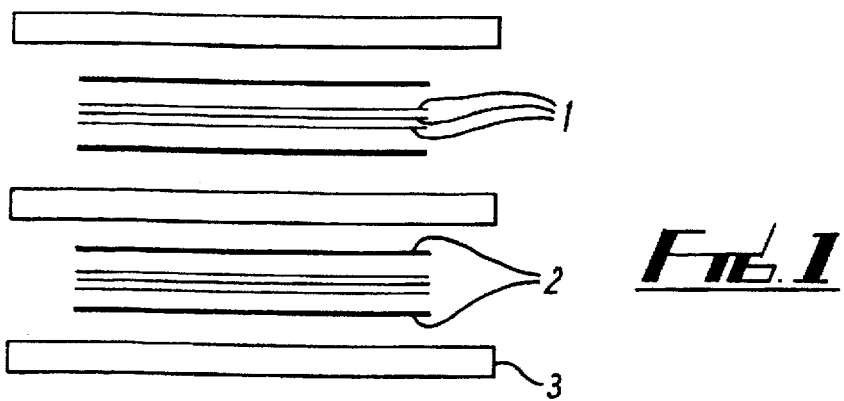
FIG. 1 is a schematic side view illustrating a prior art lay-up procedure.
Figure 2:
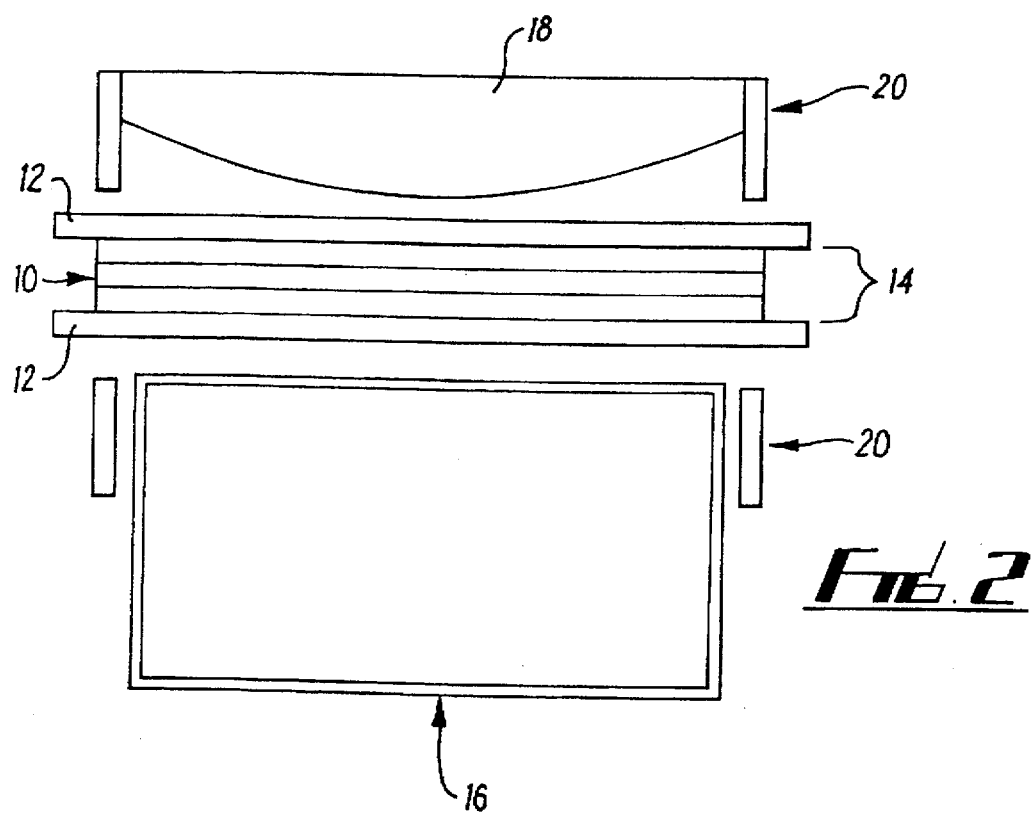
FIG. 2 is a schematic side view of an apparatus for forming a sealed unit.

Referring to FIG. 2, a number of prepreg sheets 10 are arranged in a stack 14 between copper foils 12 within a sealing apparatus. The sealing apparatus comprises a table 16 on which the stack 14 is placed, and a resilient compression pad 18 which is movable relative to the table 16 to hold the stack 14 in a firmly compressed state. Sealing elements 20 are then closed together to apply heat and pressure around the periphery of the stack 14.

The prepreg sheets 10 and copper foils 12 are conventional materials as customarily used in PCB manufacturer and are therefore not described in detail.

The apparatus of FIG. 2 produces a sealed unit 24 as illustrated in FIGS. 3a and 3b, the unit being entirely enclosed by the copper foils 12 which are sealed together in a peripheral seal area 22 by fused resin from the prepreg material. The bulk of the prepreg remains unaffected, and the sealed edge is subsequently discarded.

The sealing elements 20 may be any suitable elements which provide the heat and pressure required, typically metal plates heated by electric resistance elements.

Sealed units such as 24 are then processed in the apparatus of FIG. 4. A press table 26 is housed within an enclosure 28, the interior being kept in an high state of cleanliness by hepa fitters indicated at 30. The sealed units 24 are introduced into the enclosure 28 via a cleaning machine 30, and caul plates or pressure plates 32 (see FIG. 5) are introduced via a further cleaning machine 34.

The cleaning machines 30, 34 each comprise upper and lower cleaning rollers 36a, 36b coated with an adhesive material which removes contaminants from the surfaces of the articles passing through. Machines of this nature are more fully described in EP-A-0 214 741.

Figure 5:
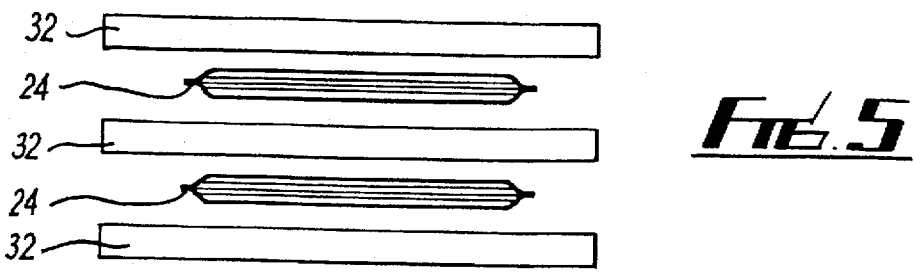
FIG. 5 illustrates the lay-up step of the present invention.

In this way, as shown in FIG. 5, a stack of pressure plates 32 and sealed units 24 is built up on the press table to form a book. Meat and pressure are then applied by known means (not shown) to fuse each unit to form a circuit board suitable for etching.

After cooling, the book is removed, the pressure plates are re-used, and the fused edges are cut from the boards to leave copper-faced laminate ready for processing.

The preliminary formation of the sealed units has the advantage that very thin copper foils can be used yet have relatively stiff units which can be passed through the cleaning machine without wrinkling. The invention further allows the working faces of the foil and the pressure plates to be thoroughly cleaned immediately before lay-up, with the lay-up area entirely separate from the initial handling area. In this way no resin dust is present in the lay-up area, or on the surfaces of the copper and the pressure plates.

The invention makes it possible to achieve faster press loading, more rapid lay-up, and reduced pits and dents, and to use stainless steel pressure plates.

We claim:

1. A method of forming a metal-faced laminate, comprising forming a stack of plastics sheets between a pair of sheets of metal foil, applying heat and pressure to the edges of the stack to fuse the edges so as to form a sealed edge around the stack to form a sealed unit, cleaning the surfaces of the sheets of metal foil and subsequently heating the sealed unit while applying pressure to its major surfaces to fuse the stack into a laminate.

2. A method according to claim 1, in which the sealed edge is formed by applying sufficient heat in the area of the edge to melt the plastics material locally, and sufficient pressure to the area of the edge to press the metal foil sheets substantially together.

3. A method according to claim 1, in which the plastics sheets are resin impregnated woven glass fiber prepregs, and the metal foil is copper.

4. A method according to claim 1, in which the two heating and pressing steps are carried out in physically separated locations.

5. A method according to claim 4, in which a number of sealed units are assembled interleaved with pressure plates to form an assembly which undergoes the second heating and pressing step.

6. A method according to claim 5, in which the assembly is formed within an enclosure, and the sealed units and pressure plates are introduced into the enclosure via means for cleaning their major faces.

* * * * *